(12) United States Patent
Kurachi

(10) Patent No.: US 8,823,054 B2
(45) Date of Patent: Sep. 2, 2014

(54) SEMICONDUCTOR SWITCHING DEVICE

(75) Inventor: Kazuhiro Kurachi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 107 days.

(21) Appl. No.: 13/556,980

(22) Filed: Jul. 24, 2012

(65) Prior Publication Data
US 2013/0153958 A1   Jun. 20, 2013

(30) Foreign Application Priority Data

Dec. 16, 2011   (JP) ................................. 2011-275306

(51) Int. Cl.
*H01L 29/02* (2006.01)
(52) U.S. Cl.
USPC .................................. 257/164; 257/E29.171
(58) Field of Classification Search
CPC ........................... H03K 17/567; H01L 29/0839
USPC ........................... 257/164, E29.171; 327/432
See application file for complete search history.

(56) References Cited

U.S. PATENT DOCUMENTS

| | | | |
|---|---|---|---|
| 5,608,595 A | 3/1997 | Gourab et al. | |
| 5,781,385 A | 7/1998 | Permuy | |
| 5,956,231 A | 9/1999 | Yamada et al. | |
| 6,337,799 B1 | 1/2002 | Belwon | |
| 6,353,258 B1 | 3/2002 | Inoue et al. | |
| 6,434,008 B1 | 8/2002 | Yamada et al. | |
| 7,141,741 B2 | 11/2006 | Yamada et al. | |
| 7,800,174 B2 * | 9/2010 | Yamaguchi et al. | 257/341 |
| 2002/0190325 A1 | 12/2002 | Mochizuki | |
| 2003/0016502 A1 * | 1/2003 | Yamada et al. | 361/705 |
| 2013/0301326 A1 * | 11/2013 | Zoels et al. | 363/132 |

FOREIGN PATENT DOCUMENTS

| | | |
|---|---|---|
| DE | 10162242 A1 | 1/2003 |
| EP | 0782265 A1 | 7/1997 |
| JP | H07-297358 A | 11/1995 |
| JP | 08-111503 | 4/1996 |
| JP | 08-195471 | 7/1996 |
| JP | H10-125856 A | 5/1998 |
| JP | 2005-012053 A | 1/2005 |

OTHER PUBLICATIONS

An Office Action issued by the German Patent Office on Jan. 10, 2014, which corresponds to German Patent Application No. DE10 2012 220 127.0 and is related to U.S. Appl. No. 13/556,980; with English language translation.
An Office Action; "Notification of Reason(s) for Refusal," issued by the Japanese Patent Office on May 7, 2014, which corresponds to Japanese Patent Application No. 2011-275306 and is related to U.S. Appl. No. 13/556,980; with English language partial translation.

* cited by examiner

*Primary Examiner* — Ha Tran T Nguyen
*Assistant Examiner* — Aaron Dehne
(74) *Attorney, Agent, or Firm* — Studebaker & Brackett PC

(57) ABSTRACT

A semiconductor switching device includes a package, and a semiconductor switching element provided in the package and having a collector electrode and an emitter electrode. A main collector terminal and a main emitter terminal reflect voltage drop generated during application of current by a floating component in the package. A second collector terminal and a second emitter terminal detect a voltage between the collector electrode and the emitter electrode without reflecting the voltage drop. A third emitter terminal is arranged close to the second emitter terminal, and detects the voltage drop generated between the main emitter terminal and the second emitter terminal.

10 Claims, 3 Drawing Sheets

F I G. 1
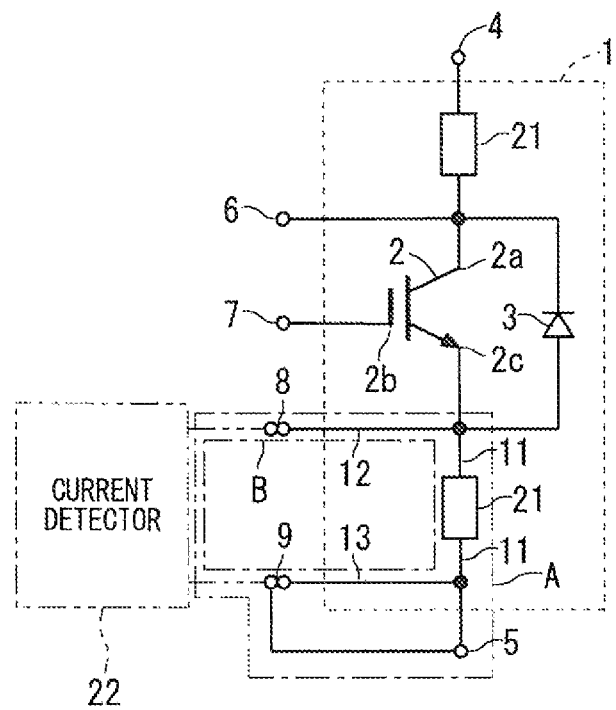
F I G. 2
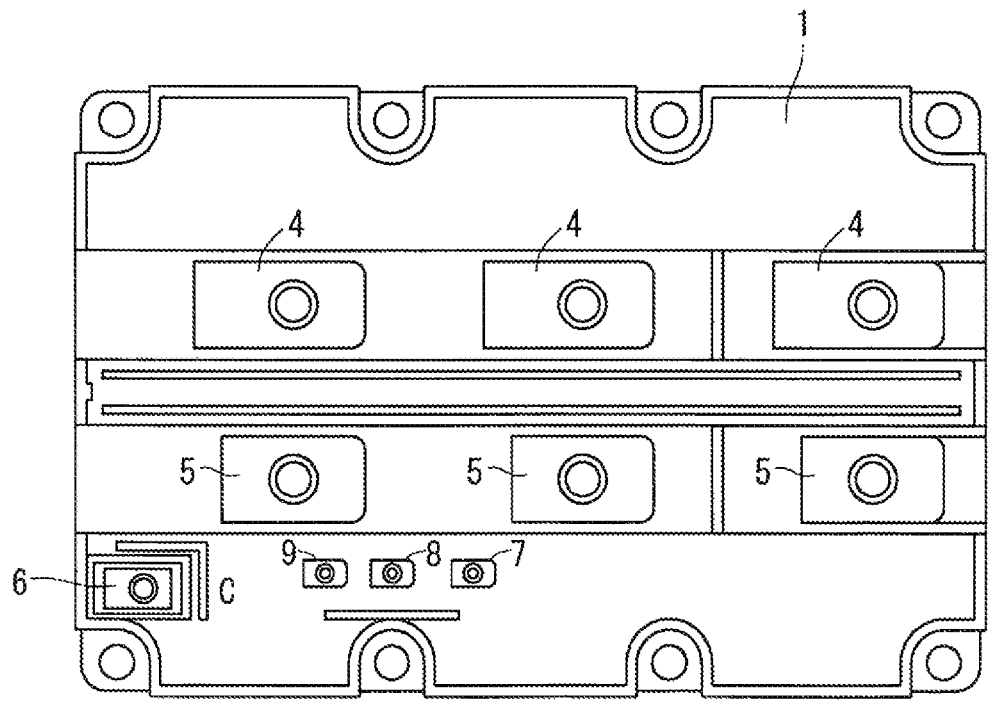

SEMICONDUCTOR SWITCHING DEVICE

BACKGROUND OF THE INVENTION

1. Field of the Invention

The present invention relates to a semiconductor switching device with a semiconductor switching element.

2. Description of the Background Art

A semiconductor switching device for use for example in power control includes a semiconductor switching element provided in a package and having a collector electrode and an emitter electrode, a main collector electrode functioning as a terminal for guiding the collector electrode to the outside, and a main emitter electrode and a second emitter electrode functioning as terminals for guiding the emitter electrode to the outside. An example of such a semiconductor switching device is disclosed in Japanese Patent Application Laid-Open No. 8-195471 (1996).

When a current is caused to flow in the semiconductor switching device of the aforementioned structure, voltage drop is generated between the main emitter terminal and the second emitter terminal as a result of presence of a floating inductance component and a floating resistive component in the package. This voltage drop and a main current flowing from the collector electrode to the emitter electrode are in corresponding relationship to each other. So, conventionally, the main current is detected based on the voltage drop.

In the conventional semiconductor switching device, the main emitter terminal and the second emitter terminal are not close to each other. So, if a current detector for detecting the main current based on the aforementioned voltage drop is electrically connected to these two terminals, a resultant closed loop of wiring passing through the current detector and the two terminals is made relatively large. As a result, the main current to be detected by the current detector is affected strongly by inductive noise generated during switching, making it difficult to detect the main current accurately. Further, means for suppressing effect by inductive noise is not devised for an interconnect line inside the semiconductor switching device. This also makes it difficult to accurately detect the main current flowing in the semiconductor switching element.

SUMMARY OF THE INVENTION

It is an object of the present invention to provide a technique capable of suppressing inductive noise.

The present invention is intended for a semiconductor switching device, including: a package; a semiconductor switching element provided in the package, the semiconductor switching element having a collector electrode and an emitter electrode; and a main collector terminal and a main emitter terminal that guide the collector electrode and the emitter electrode to the outside respectively. The main collector terminal and the main emitter terminal reflect voltage drop generated during application of current by a floating inductance component and a floating resistive component in the package. The semiconductor switching device further includes: a second collector terminal and a second emitter terminal capable of detecting a voltage between the collector electrode and the emitter electrode without reflecting the voltage drop; and a third emitter terminal arranged close to the second emitter terminal. The third emitter terminal is capable of detecting the voltage drop generated between the main emitter terminal and the second emitter terminal.

The third emitter terminal is arranged close to the second emitter terminal. So, if a current detector for detecting a main current based on the voltage drop is electrically connected to the second and third emitter terminals instead of being connected to the second emitter terminal and the main emitter terminal, a resultant closed loop of wiring passing through the current detector and the two terminals can be made small. As a result, effect by inductive noise generated during switching is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a wiring diagram showing the structure of a semiconductor switching device of a first preferred embodiment of the present invention;

FIG. 2 is an external view of the structure of the semiconductor switching device of the first preferred embodiment;

DESCRIPTION OF THE PREFERRED EMBODIMENTS

First Preferred Embodiment

Figure 3:
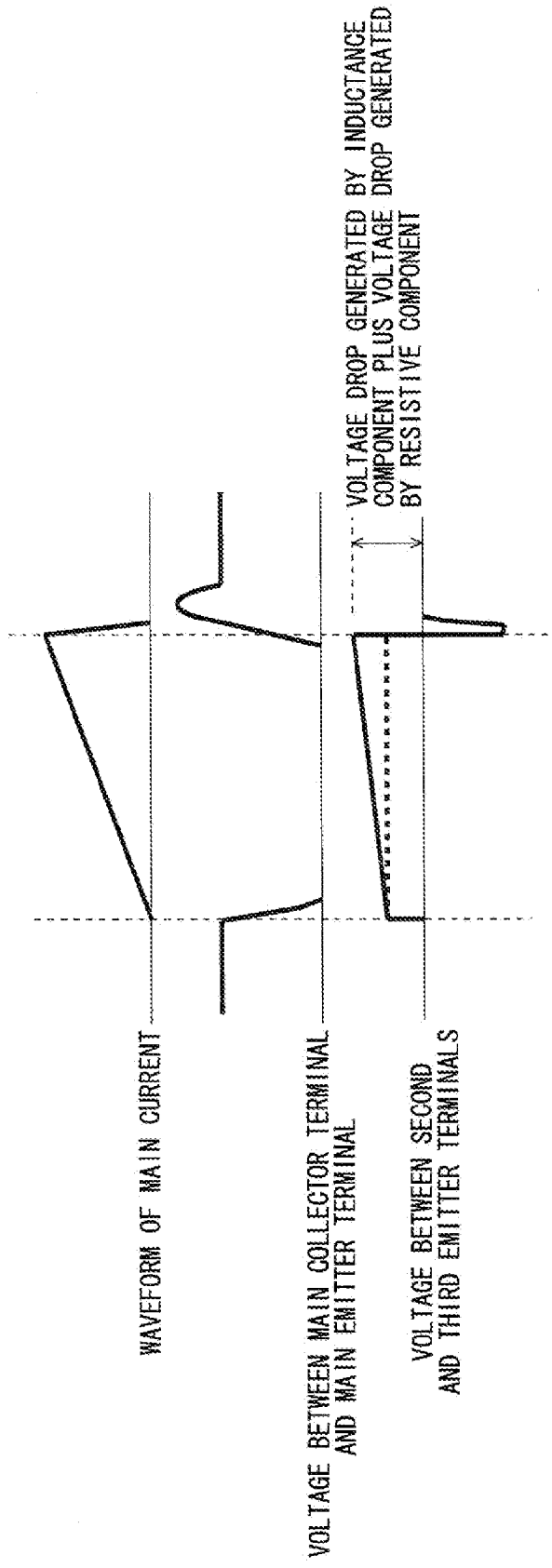
FIG. 3 shows a result of operation of the semiconductor switching device of the first preferred embodiment.

FIG. 1 is a wiring diagram showing the structure of a semiconductor switching device of a first preferred embodiment of the present invention. FIG. 2 is an external view of the structure of the semiconductor switching device.

As shown in FIG. 1, the semiconductor switching device of the first preferred embodiment includes a package 1, a semiconductor switching element 2, a diode 3, a main collector terminal 4, a main emitter terminal 5, a second collector terminal 6, a gate terminal 7, a second emitter terminal 8, and a third emitter terminal 9.

The package 1 houses the semiconductor switching element 2 and the diode 3. The semiconductor switching element 7 has a collector electrode 2a, a gate electrode 2b, and an emitter electrode 2c. The diode 3, the forward direction of which coincides with a direction from the emitter electrode 2c to the collector electrode 2a, is connected in parallel to the semiconductor switching element 2 between the collector and emitter electrodes 2a and 2c.

The collector electrode 2a is electrically connected to the main collector terminal 4 and the second collector terminal 6. The gate electrode 2b is electrically connected to the gate terminal 7. The emitter electrode 2c is electrically connected to the main emitter terminal 5, and the second and third emitter terminals 8 and 9.

As shown in FIG. 2, in the first preferred embodiment, the main collector terminal 4, the main emitter terminal 5, the second collector terminal 6, the gate terminal 7, and the second and third emitter terminals 8 and 9 are formed on a surface of the package 1. To be specific, the main collector terminal 4 and the main emitter terminal 5 function as terminals to guide the collector electrode 2a and the emitter electrode 2c to the outside respectively.

In the first preferred embodiment, when a current is caused to flow in the semiconductor switching device, voltage drop is generated as a result of presence of a floating inductance component and a floating resistive component (hereinafter called a "floating component 21") in the package 1. In the first preferred embodiment, this voltage drop is generated between the collector electrode 2a and the main collector terminal 4, and between the emitter electrode 2c and the main emitter terminal 5 or between the emitter electrode 2c and the third emitter terminal 9.

In this structure of the first preferred embodiment, the main collector terminal 4 and the main emitter terminal 5 reflect voltage drop generated by the floating component 21 during application of current. To be specific, the main collector terminal 4 and the main emitter terminal 5 are capable of detecting a voltage obtained by incorporating a voltage reflecting the voltage drop generated by the floating component 21 during application of current into a collector-to-emitter voltage.

Further, voltage drop generated between the main emitter terminal 5 and the second emitter terminal 8 by the floating component 21 during application of current can be detected by detecting a voltage between the third and second emitter terminals 9 and 8. To be specific, in the first preferred embodiment, the third emitter terminal 9 is electrically equivalent to the main emitter terminal 5, making it possible to detect voltage drop generated between the main emitter terminal 5 and the second emitter terminal 8 by the floating component 21 during application of current.

The third emitter terminal 9 may be formed by the exemplary way as follows. In a structure where the emitter electrode 2c and the main emitter terminal 5 are connected through an interconnect line made of a metal plate not shown in the drawings, part of the interconnect line made of the metal plate inside the surface of the package 1 and close to the surface of the package 1 is electrically connected to the third emitter terminal 9 within the package 1 through an interconnect line of the lowest possible inductance component and the lowest possible floating resistive component.

The second collector terminal 6 and the second emitter terminal 8 are capable of detecting a voltage between the collector and emitter electrodes 2a and 2c without reflecting voltage drop generated by the floating component 21 during application of current. The second collector terminal 6 and the second emitter terminal 8 may be formed by shortening an interconnect line between the second collector terminal 6 and the collector electrode 2a, and by shortening an interconnect line between the second emitter terminal 8 and the emitter electrode 2c.

The third emitter terminal 9 is arranged close to the second emitter terminal 8. In the first preferred embodiment, as shown in FIG. 2, the third emitter terminal 9 is arranged closer to the second emitter terminal 8 than to the main emitter terminal 5.

FIG. 3 shows waveforms relating to the semiconductor switching device of the first preferred embodiment of the aforementioned structure. The waveforms of FIG. 3 include the waveform of a main current flowing between the main collector terminal 4 and the main emitter terminal 5, the waveform of a voltage between the main collector terminal 4 and the main emitter terminal 5, and the waveform of a voltage between the second and third emitter terminals 8 and 9. As shown in FIG. 3, the voltage between the second and third emitter terminals 8 and 9 resembles the waveform of the main current. This means that the main current flowing between the main collector terminal 4 and the main emitter terminal 5, namely, the main current flowing in the semiconductor switching element 2 can be detected by detecting the voltage between the second and third emitter terminals 8 and 9.

A semiconductor switching device relevant to the semiconductor switching device of the first preferred embodiment does not have the third emitter terminal 9. So, in this relevant semiconductor switching device, a current detector 22 shown by imaginary lines (alternate long and two short dashed lines) in FIG. 1 is electrically connected to the second emitter terminal 8 and the main emitter terminal 5, and the main current flowing in the semiconductor switching element 2 is detected based on voltage drop generated between the second emitter terminal 8 and the main emitter terminal 5.

In this relevant semiconductor switching device, however, the second emitter terminal 8 and the main emitter terminal 5 are not close to each other, and a control driving circuit (such as a gate driving circuit 31 of FIG. 4) including the current detector 22 is connected to the main emitter terminal 5 through a cable or a bus bar. This makes a closed loop (closed loop A shown by alternate long and short dashed lines in FIG. 1) relatively large that is formed by wiring passing through the current detector 22, the second emitter terminal 8, and the main emitter terminal 5. As a result, the main current to be detected by the current detector 22 is affected strongly by inductive noise generated during switching, making it difficult to detect the main current accurately.

In contrast, in the semiconductor switching device, of the first preferred embodiment, the third emitter terminal 9 is arranged close to the second emitter terminal 8. Thus, the current detector 22 for detecting the main current based on voltage drop is not electrically connected to the second emitter terminal 8 and the main emitter terminal 5, but it is electrically connected to the second and third emitter terminals 8 and 9. Thus, a resultant closed loop (closed loop B shown by alternate long and short dashed lines in FIG. 1) of wiring passing through the current detector 22 and the two terminals is made smaller than the aforementioned closed loop A. This means that the closed loop of wiring passing through the current detector 22 and the two terminals can be made small, making it possible to suppress effect by inductive noise generated during switching on the main current to be detected by the current detector 22. As a result, the main current flowing in the semiconductor switching element 2 is detected accurately to allow correct detection of abnormal operation such as generation of an overcurrent and a short-circuit.

In the aforementioned structure, the second and third emitter terminals 8 and 9 may be provided to one coaxial terminal or two connector terminals. This structure makes it possible to form electrical connection to the second and third emitter terminals 8 and 9 easily.

FIG. 1 shows a first interconnect line 12 (interconnect line) which branches off a main emitter interconnect line 11 connecting the emitter electrode 2c and the main emitter terminal 5 and reaches the second emitter terminal 8. It also shows a second interconnect line 13 (interconnect line) which branches off the main emitter interconnect line 11 and reaches the third emitter terminal 9. The first and second interconnect lines 12 and 13 may be close to each other. This structure makes it possible to minimize a closed loop of wiring, thereby suppressing effect by inductive noise generated during switching. As a result, a current flowing in the semiconductor switching element 2 is detected accurately.

The first and second interconnect lines 12 and 13 may be twisted around each other to form a twisted interconnect line. Or, the first and second interconnect lines 12 and 13 may be both laminated together to form a laminated interconnect line. These structures allow suppression of effect by outside inductive noise, so that a current flowing in the semiconductor switching element 2 is detected accurately.

The semiconductor switching element 2 may include one, or a combination of two or more of an IGBT, a MOSFET, a thyristor, a GTO thyristor, a GCT thyristor and a diode.

Second Preferred Embodiment

Figure 4:
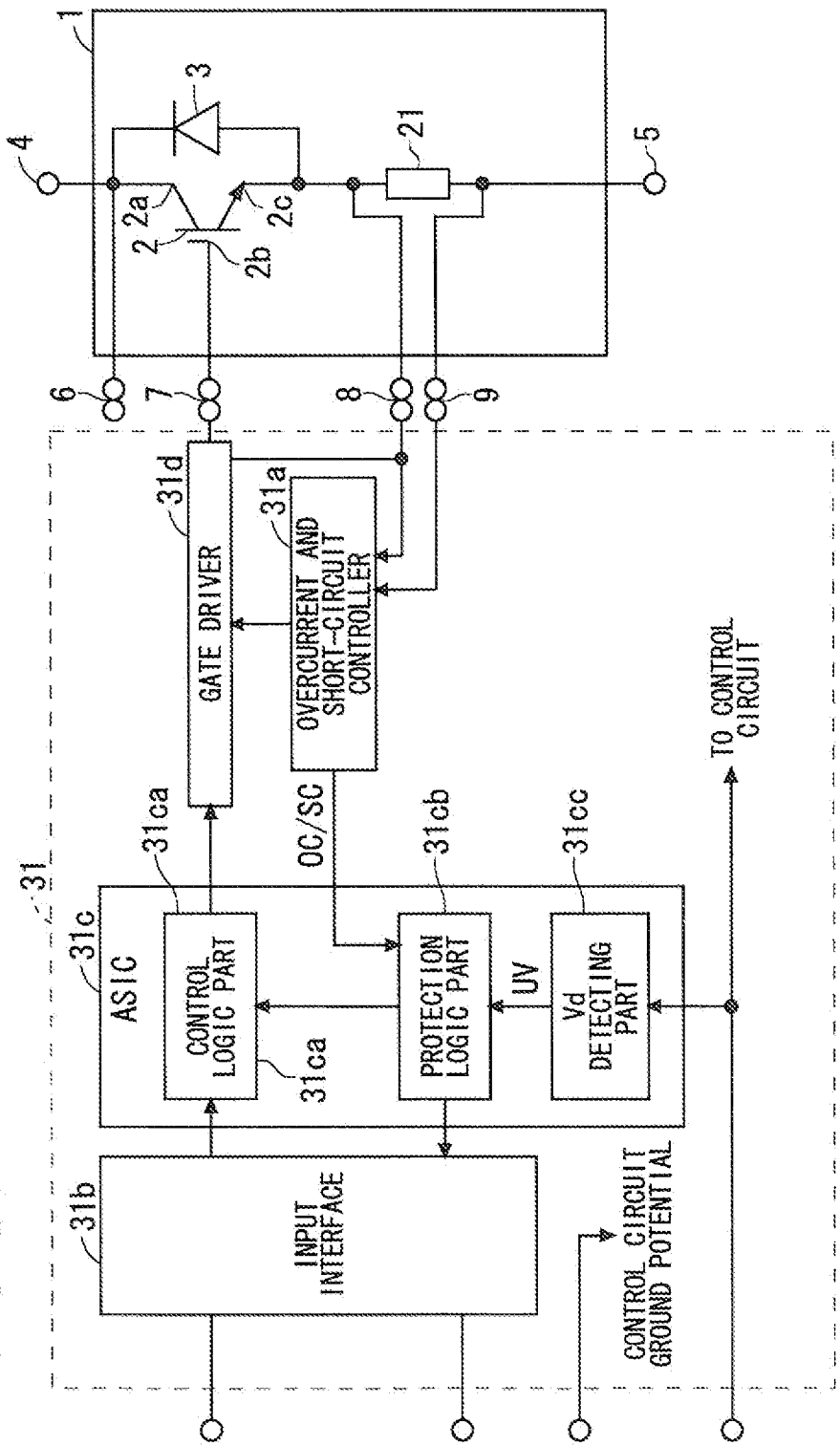
FIG. 4 is a wiring diagram showing the structure of a semiconductor switching device of a second preferred embodiment of the present invention.

FIG. 4 is a wiring diagram showing the structure of a semiconductor switching device of a second preferred embodiment of the present invention. The semiconductor switching device of the second preferred embodiment includes components same as or similar to those described in the first preferred embodiment. These components are identified by the same reference numerals, and will not be described again.

As shown in FIG. 4 in the second preferred embodiment, a gate driving circuit 31 (control circuit) is electrically connected to the second and third emitter terminals 8 and 9. The gate driving circuit 31 controls the operation of the semiconductor switching element 2 based on voltage drop (that is practically a main current) generated between the second and third emitter terminals 8 and 9. The description is given based on the assumption that the semiconductor switching element 2 is an IGBT.

The gate driving circuit 31 includes an overcurrent and short-circuit controller 31a, an input interface 31b, an ASIC 31c, and a gate driver 31d. The ASIC 31c includes a control logic part 31ca, a protection logic part 31cb, and a Vd detecting part 31cc.

The overcurrent and short-circuit controller 31a is electrically, connected to the second and third emitter terminals 8 and 9, and receives voltage drop (that is practically a main current) generated between the second and third emitter terminals 8 and 9. Based on the voltage drop given to the overcurrent and short-circuit controller 31a, the overcurrent and short-circuit controller 31a outputs signal to the ASIC 31c (protection logic part 31cb), or controls the gate driver 31d.

The ASIC 31c controls the gate driver 31d based on the signal given from the overcurrent and short-circuit controller 31a and/or a signal given to the input interface 31b. The gate controller 31d controls the voltage of the gate electrode 2b of the semiconductor switching element 2 through the gate terminal 7 under control of the overcurrent and short-circuit controller 31a and the ASIC 31c.

The semiconductor switching device of the second preferred embodiment has the structure comparable to that of the first preferred embodiment. Thus, the semiconductor switching device of the second preferred embodiment is capable of suppressing effect by inductive noise generated during switching, so that a current flowing in the semiconductor switching element 2 is detected accurately. As a result, abnormal operation such as generation of an overcurrent and a short-circuit is detected correctly. This acts advantageously, particularly in view of the fact that a conventional semiconductor switching device has a relatively large closed loop of wiring as a main emitter terminal and the gate driving circuit 31 are connected through a cable or a bus bar.

Further, in the second preferred embodiment, the gate driving circuit 31 (control circuit) is electrically connected to the second and third emitter terminals 8 and 9. The gate driving circuit 31 controls the operation of the semiconductor switching element 2 based on voltage drop (that is practically a main current) generated between the second and third emitter terminals 8 and 9. This allows the semiconductor switching element 2 to operate based on an accurately detected current, thereby promoting safety in the operation of the semiconductor switching device.

The semiconductor switching device of the aforementioned structure may further include the gate driving circuit 31 provided in the package 1. This allows size reduction and weight saving of the structure that enables the semiconductor switching element 2 to operate safely.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor switching device, comprising:
   a package;
   a semiconductor switching element provided in said package, the semiconductor switching element having a collector electrode and an emitter electrode;
   a main collector terminal and a main emitter terminal that guide said collector electrode and said emitter electrode to the outside respectively, the main collector terminal and the main emitter terminal reflecting voltage drop generated during application of current by a floating inductance component and a floating resistive component in said package;
   a second collector terminal and a second emitter terminal capable of detecting a voltage between said collector electrode and said emitter electrode without reflecting said voltage drop; and
   a third emitter terminal arranged close to said second emitter terminal, the third emitter terminal being capable of detecting said voltage drop generated between said main emitter terminal and said second emitter terminal.

2. The semiconductor switching device according to claim 1, wherein
   said main emitter terminal, and said second and third emitter terminals are formed on a surface of said package, and
   said third emitter terminal is closer to said second emitter terminal than to said main emitter terminal.

3. The semiconductor switching device according to claim 1, wherein said second and third emitter terminals are provided to a coaxial terminal or a connector terminal.

4. The semiconductor switching device according to claim 1, wherein
   a first interconnect line branches off a main emitter interconnect line connecting said emitter electrode and said main emitter terminal and reaches said second emitter terminal,
   a second interconnect line branches off said main emitter interconnect line and reaches said third emitter terminal,
   the first and second interconnect lines are close to each other.

5. The semiconductor switching device according to claim 1, wherein
   a first interconnect line branches off a main emitter interconnect line connecting said emitter electrode and said main emitter terminal and reaches said second emitter terminal,
   a second interconnect line branches off said main emitter interconnect line and reaches said third emitter terminal,
   the first and second interconnect lines are twisted around each other to form a twisted interconnect line.

6. The semiconductor switching device according to claim 1, wherein
   a first interconnect line branches off a main emitter interconnect line connecting said emitter electrode and said main emitter terminal and reaches said second emitter terminal,
   a second interconnect line branches off said main emitter interconnect line and reaches said third emitter terminal, the first and second interconnect lines are both laminated to form a laminated interconnect line.

7. The semiconductor switching device according to claim 1, wherein a current detector is electrically connected to said second and third emitter terminals.

8. The semiconductor switching device according to claim 1, wherein a control circuit is electrically connected to said second and third emitter terminals, the control circuit controlling the operation of said semiconductor switching element based on said voltage drop generated between said second and third emitter terminals.

9. The semiconductor switching device according to claim 8, further comprising said control circuit provided in said package.

10. The semiconductor switching device according to claim 1, wherein said semiconductor switching element includes at least one of an IGBT, MOSFET, a thyristor, a GTO thyristor, a GCT thyristor, and a diode.

\* \* \* \* \*